(12) United States Patent
Lu et al.

(10) Patent No.: US 7,679,382 B2
(45) Date of Patent: Mar. 16, 2010

(54) STEPPED PCB FOR PROBE CARD, PROBE CARD HAVING THE SAME AND METHOD FOR CLAMPING THE PROBE CARD

(75) Inventors: Fu-Chin Lu, Hsinchu Hsiang (TW); Chi-Chong Chien, Hsinchu Hsiang (TW)

(73) Assignee: MPI Corporation, Chu-Pei (TW)

( * ) Notice: Subject to any disclaimer, the term of this patent is extended or adjusted under 35 U.S.C. 154(b) by 509 days.

(21) Appl. No.: 11/512,368

(22) Filed: Aug. 30, 2006

(65) Prior Publication Data

US 2007/0090847 A1 Apr. 26, 2007

(30) Foreign Application Priority Data

Oct. 20, 2005 (TW) .............................. 94136735 A

(51) Int. Cl.
*G01R 31/02* (2006.01)

(52) U.S. Cl. ..................................... 324/754

(58) Field of Classification Search ................. 324/754, 324/761–762, 765, 158.1, 757, 758; 257/48; 439/81, 482
See application file for complete search history.

(56) References Cited

U.S. PATENT DOCUMENTS 6,927,586 B2 * 8/2005 Thiessen ..................... 324/754
6,965,244 B2 * 11/2005 Miller ........................ 324/754

* cited by examiner

*Primary Examiner*—Ha Tran T Nguyen
*Assistant Examiner*—Tung X Nguyen
(74) *Attorney, Agent, or Firm*—Bacon & Thomas, PLLC

(57) ABSTRACT

A stepped printed circuit board for a probe card and for clamping by a testing machine is disclosed. The stepped printed circuit board includes a main body and a protruding body. The main body has a conductive circuit pattern arranged therein and a border area for the clamping of the testing machine. The protruding body is joined to a bottom side of the main body beyond the border area and defines with the bottom side of the main body an elevational difference. The protruding body has a conductive circuit pattern arranged therein and electrically connected to the conductive circuit pattern of the main body.

9 Claims, 5 Drawing Sheets

US 7,679,382 B2

STEPPED PCB FOR PROBE CARD, PROBE CARD HAVING THE SAME AND METHOD FOR CLAMPING THE PROBE CARD

BACKGROUND OF THE INVENTION

1. Field of the Invention

The present invention relates to probe cards and more particularly, to a printed circuit board having a stepped structure for use in a probe card, and a probe card comprising the same. The present invention relates also to a method for clamping the probe card using the stepped printed circuit board.

2. Description of the Related Art

The function of an integrated circuit must be examined by means of a probe card before packaging, so that defective pieces can be removed, increasing the final yield rate.

A vertical probe card generally comprises a printed circuit board (hereinafter referred to 'PCB'), an adapter substrate, and a probe head. The adapter substrate has one side joined to the PCB and electrically connected to the circuits of the PCB. The probe head is connected to the other side of the adapter substrate, allowing electric connection of the vertical probes of the probe head to the PCB. When in use, the PCB must be clamped by a testing machine to ensure stability of the probe card. However, the clamping size acceptable to the testing machine is limited. Therefore, the thickness of the PCB must be within the clamping size acceptable to the testing machine. Further, the adapter substrate is conventionally laminated layer by layer by the so-called built up process to increase its thickness. Because the thickness of each medium layer is limited to 30-60 µm and the adapter substrate has to be formed vias therein by laser ablation, the thickness of the adapter substrate is normally defined within 0.8-1.1 mm. The thickness limitation on the PCB and the adapter substrate and the length limitation on the vertical probes of the probe head may cause a contact failure between the vertical probes and the test sample after the testing machine has been adjusted to the bottom limit position. In this case, the test cannot be performed.

In order to eliminate the aforesaid problem, there are providers who join two PCBs or adapter substrates with solder balls by the reflow solder process, keeping the two PCBs or the adapter substrates electrically connected together. This method increases the total thickness of the probe card, however it also brings drawbacks. The first drawback is that the use of the solder balls to electrically connect the two PCBs or the adapter substrates causes a signal reflection and loss, resulting in a poor signal transmission quality. The second drawback is that the leveling between the two PCBs or the adapter substrates becomes poor after the reflow soldering process due to technical problem and manufacturing conditions, such as size difference of solder balls. The third drawback is that the bonding force of the solder balls after the reflow soldering process may vary with operating conditions, and the relatively thinner adapter substrate may be damaged or the solder balls may be forced out of place upon an impact. The fourth drawback is that the application of reflow soldering process relatively complicates the manufacturing process and increases the manufacturing cost.

SUMMARY OF THE INVENTION

The present invention has been accomplished under the circumstances in view. It is the main object of the present invention to provide a stepped PCB for use in a probe card, which increases the whole thickness of the probe card while fitting the specifications of regular testing machines, solving testing depth problem.

It is another object of the present invention to provide a stepped PCB for probe card, which prevents exposure of electric signal transmission line to the surroundings, thereby eliminating over-reflection and oxidation problems.

To achieve these objects of the present invention, a stepped printed circuit board provided by the present invention for a probe card and for clamping by a testing machine comprises a main body and a protruding body. The main body has a conductive circuit pattern arranged therein and a border area for the clamping of the testing machine. The protruding body is joined to a bottom side of the main body and defines with the bottom side of the main body an elevational difference. The protruding body has a conductive circuit pattern arranged therein and electrically connected to the conductive circuit pattern of the main body.

The present invention also provides a probe card comprises the aforesaid stepped printed circuit board and a probe head having a plurality of vertical probes electrically respectively connected to the protruding body. In an alternative example, the probe card comprises the aforesaid stepped printed circuit board, an adapter substrate electrically connected to the protruding body, and a probe head having a plurality of vertical probes electrically respectively connected to the adapter substrate.

In addition, the present invention also provide a method for clamping a probe card comprising the steps of (a) providing a probe card as defined above, (b) placing the probe card in a testing machine for enabling the border area of the main body to be clamped by the testing machine, and (c) electrically connecting the conductive circuit pattern of the main body to the testing machine.

DETAILED DESCRIPTION OF THE INVENTION

Figure 1:
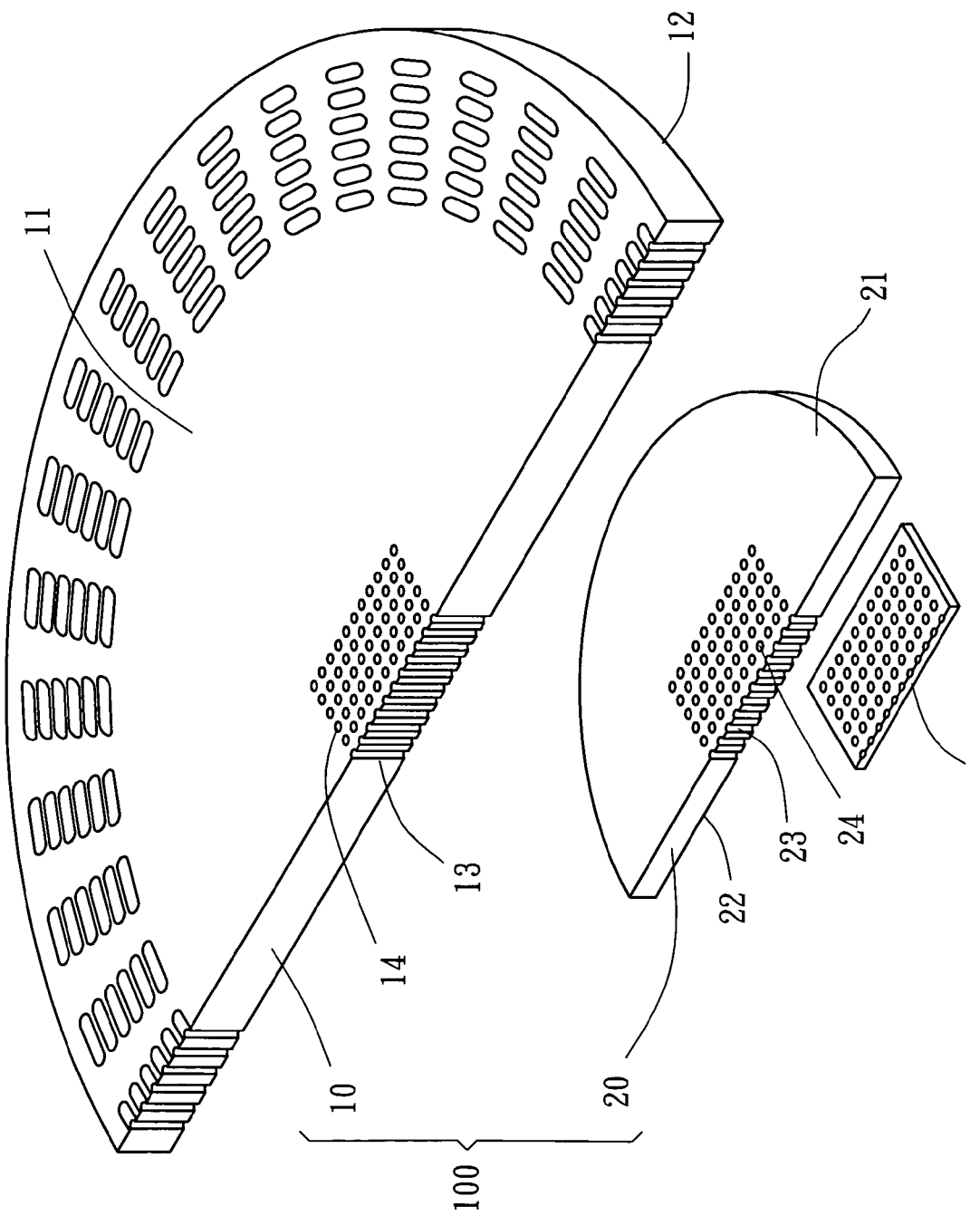
FIG. 1 is a schematic exploded view of a stepped PCB according to a first preferred embodiment of the present invention.
Figure 2:
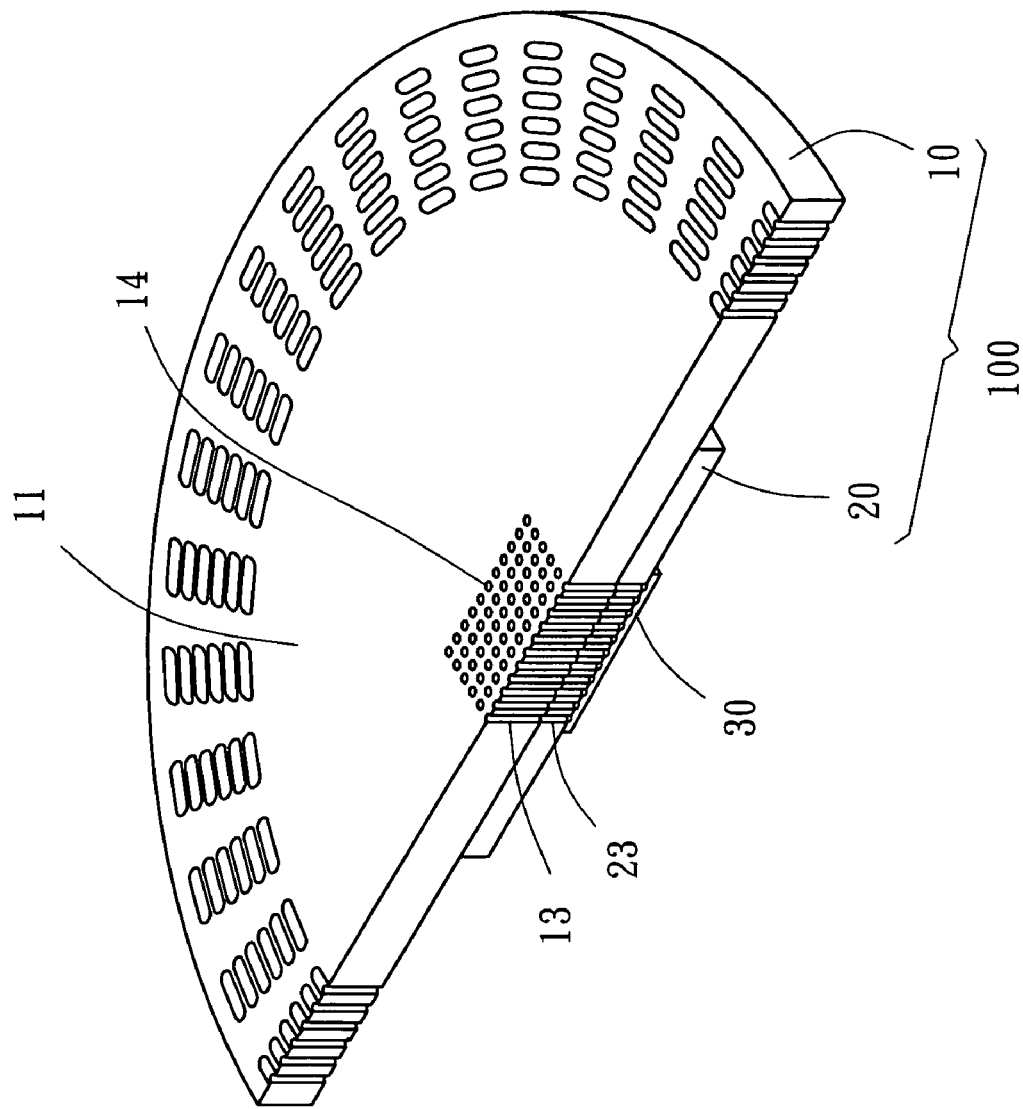
FIG. 2 is a schematic perspective assembly view of the stepped PCB according to the first preferred embodiment of the present invention.
Figure 3:
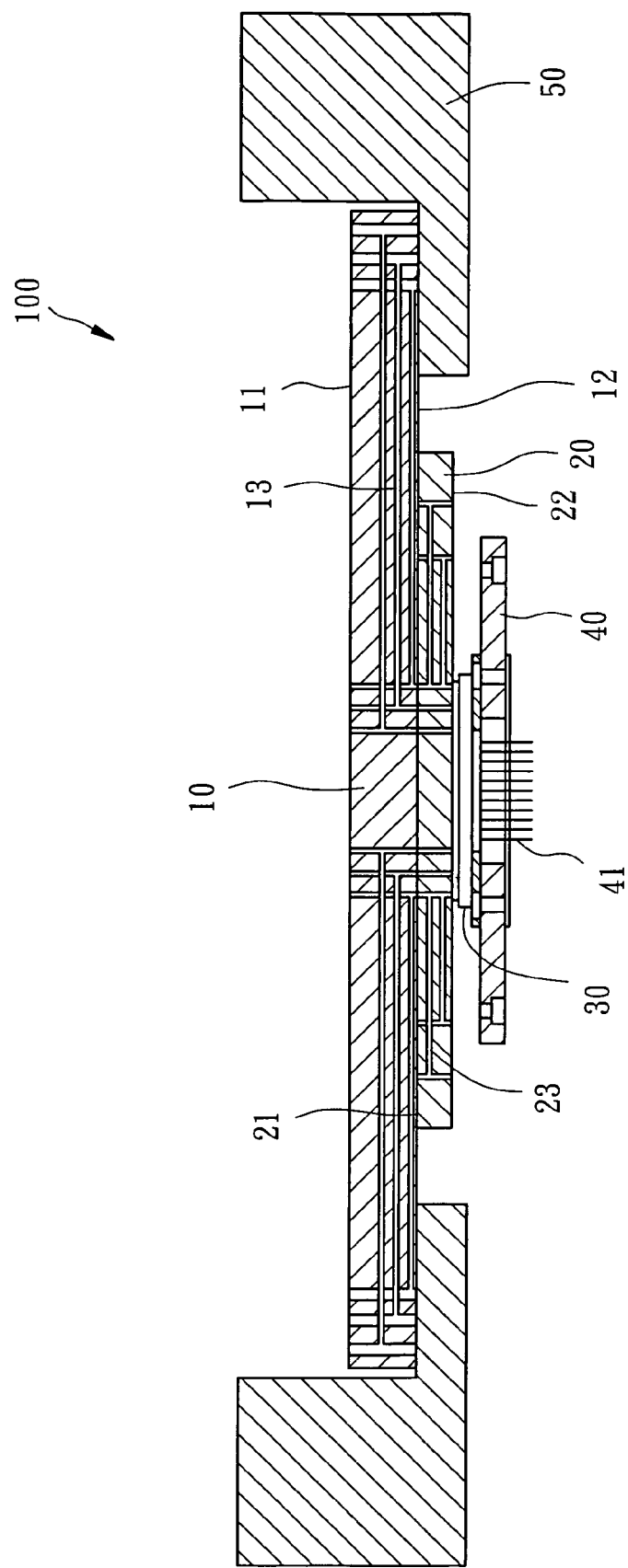
FIG. 3 is a schematic sectional view, showing the stepped PCB according to the first preferred embodiment of the present invention in use with an adapter substrate and a probe head.

As shown in FIGS. 1-3, a stepped PCB 100 in accordance with the first preferred embodiment of the present invention comprises a main body 10, and a protruding body 20.

The main body 10 is a PCB with a predetermined shape having a first side 11 and a second side 12 opposite to the first side 11. The main body 10 can be made by laminating FR-4, FR-5, polyimide (PI) or BT materials through the built up process at a predetermined pressure and temperature. A conductive circuit pattern 13 is formed inside the main body 10 as shown in FIG. 3 through the laminating process, and a plurality of conductive contacts 14 are respectively formed on the first side 11 and the second side 12 on the middle within a predetermined area and electrically connected to the circuit pattern 13. The thickness of the main body 10 fits the clamping range of the conventional testing machine (about 3.2 mm-7.0 mm). The width of the main body 10 is within 6-17 inches. Therefore, the testing machine 50 can clamp the periphery of the main body 10.

The protruding body 20 is a PCB having a predetermined shape. The size of the protruding body 20 is smaller than that of the main body 10. The protruding body 20 has a top side 21 and a bottom side 21 opposite to the top side 21. The protruding body 20 can be made by laminating FR-4, FR-5, polyimide (PI) or BT materials through the built up process at a predetermined pressure and temperature. A conductive circuit pattern 23 is formed inside the protruding body 20 as shown in FIG. 3 through the laminating process, and a plurality of conductive contacts 24 are respectively formed on the top side 21 and the bottom side 22 on the middle within a predetermined area and electrically connected to the conductive circuit pattern 23. The thickness of the protruding body 20 is about 0.5-6.0 mm. The width of the protruding body 20 is within 16 inches.

The above description describes the structure of the stepped PCB 100. The installation and use of the stepped PCB 100 will be described hereinafter.

The configuration and location of the conductive contacts 24 at the top side 21 of the protruding body 20 are corresponding to the configuration and location of the conductive contacts 14 at the second side 12 of the main body 10. Therefore, the conductive contacts 24 at the top side 21 of the protruding body 20 can be respectively bonded to the conductive contacts 14 at the second side 12 of the main body 10 by means of a laminating process using a polypropylene film that is common employed to the fabrication of PCBs, thereby joining the main body 10 and the protruding body 20 as a unity member. When the main body 10 and the protruding body 20 are joined together, the conductive circuit pattern 13 of the main body 10 and the conductive circuit pattern 23 of the protruding body 20 are electrically connected together. At this time, an elevation difference is produced between the second side 12 of the main body 10 and the periphery of the protruding body 20 due to the fact that the size of the protruding body 20 is smaller than that of the main body 10, and the border area of the main body 10 corresponding to the area of the elevation difference is provided for clamping by the testing machine 50. Further, an adapter substrate 30 is bonded with one side thereof to the bottom side 22 of the protruding body 20, keeping the adapter substrate 30 electrically connected to the protruding body 20 and the main body 10. The adapter substrate 30 has a predetermined configuration and is a known product, no further detailed description in this regard is necessary. Thereafter, a probe head 40 having a predetermined amount of vertical probes 41 is connected to the other side of the adapter substrate 30 opposite to the protruding body 20, as shown in FIG. 3, enabling one end of each of the vertical probes 41 to be respectively and electrically connected to the adapter substrate 30 and the other end of each of the vertical probes 41 to be extended out of the adapter substrate 30 for the contact of the test sample, for example, an integrated circuit chip (not shown). At final, the connecting contacts 14 at the first side 11 of the main body 10 are respectively electrically connected to the testing machine 50, enabling the tested signal to be transmitted from the test sample to the testing machine for processing.

According to the aforesaid design, the use of the protruding body 20 increases the total thickness of the PCB 100 while maintaining the clamping thickness that is provided by the main body 20 within a limited range acceptable to the testing machine 50, i.e., the distance between the vertical probes 41 and the main body 10 at the testing machine 50 can be relatively increased, solving he problem of short test depth of the testing machine 50.

Further, because the protruding body 20 and the main body 10 are bonded together through a laminating process at a high pressure and a high temperature as commonly employed to the fabrication of PCBs, no extra manufacturing process or cost will be produced. Further, because the conductive circuit pattern 13 and the conductive circuit pattern 23 are respectively formed inside the main body 10 and the protruding body 20, i.e. they are not exposed to the outside, the invention eliminates signal reflection or loss. Further, the bonding of the protruding body 20 and the main body 10 is carried out by means of the use of a polished steel plate for positioning, the finished product has a better plainness. Further, because the protruding body 20 and the main body 10 are bonded together through a laminating process at a high temperature and a high pressure, the bonding strength is much higher than through a reflow soldering process.

Figure 4:
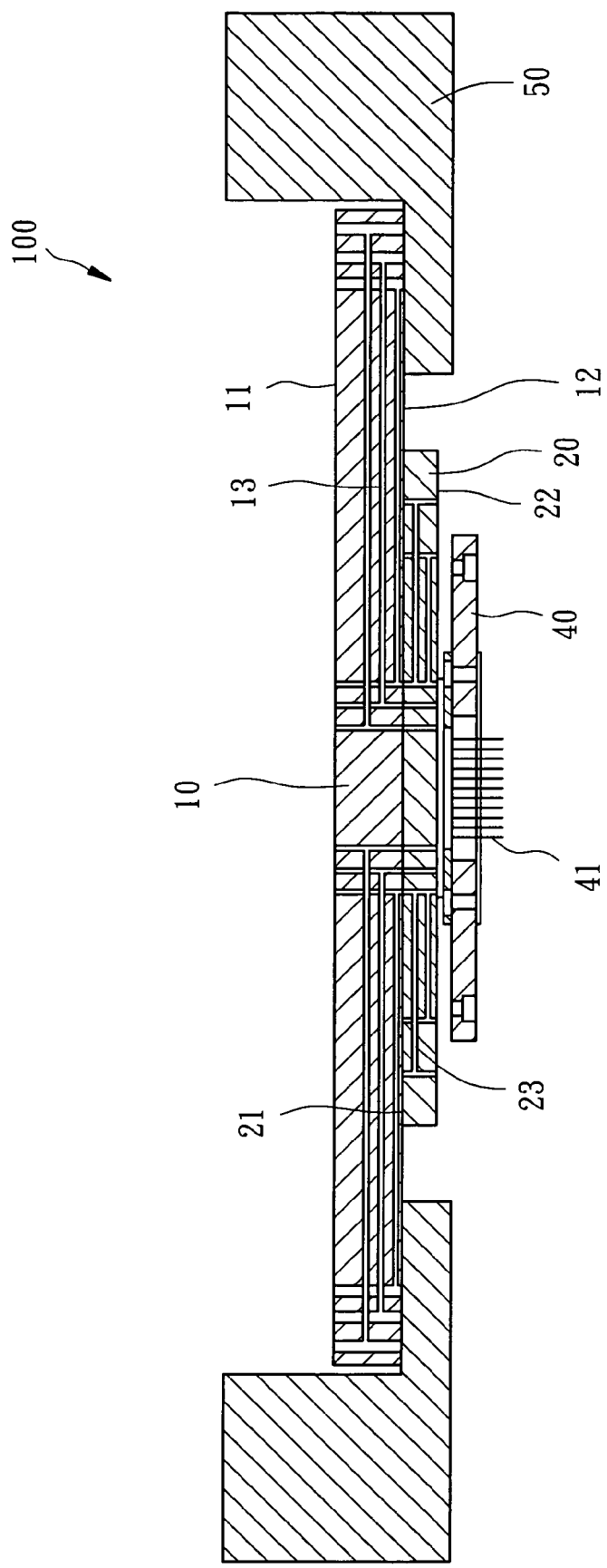
FIG. 4 is another schematic sectional view, showing the stepped PCB according to the first preferred embodiment of the present invention in use with a probe head.

FIG. 4 shows the stepped PCB 100 is cooperated with the probe head 40 only, i.e. the aforesaid adapter substrate 30, is eliminated. Under this circumstance, the circuit of the aforesaid adapter substrate 30 is directly formed in the protruding body 20, saving much component cost.

Figure 5:
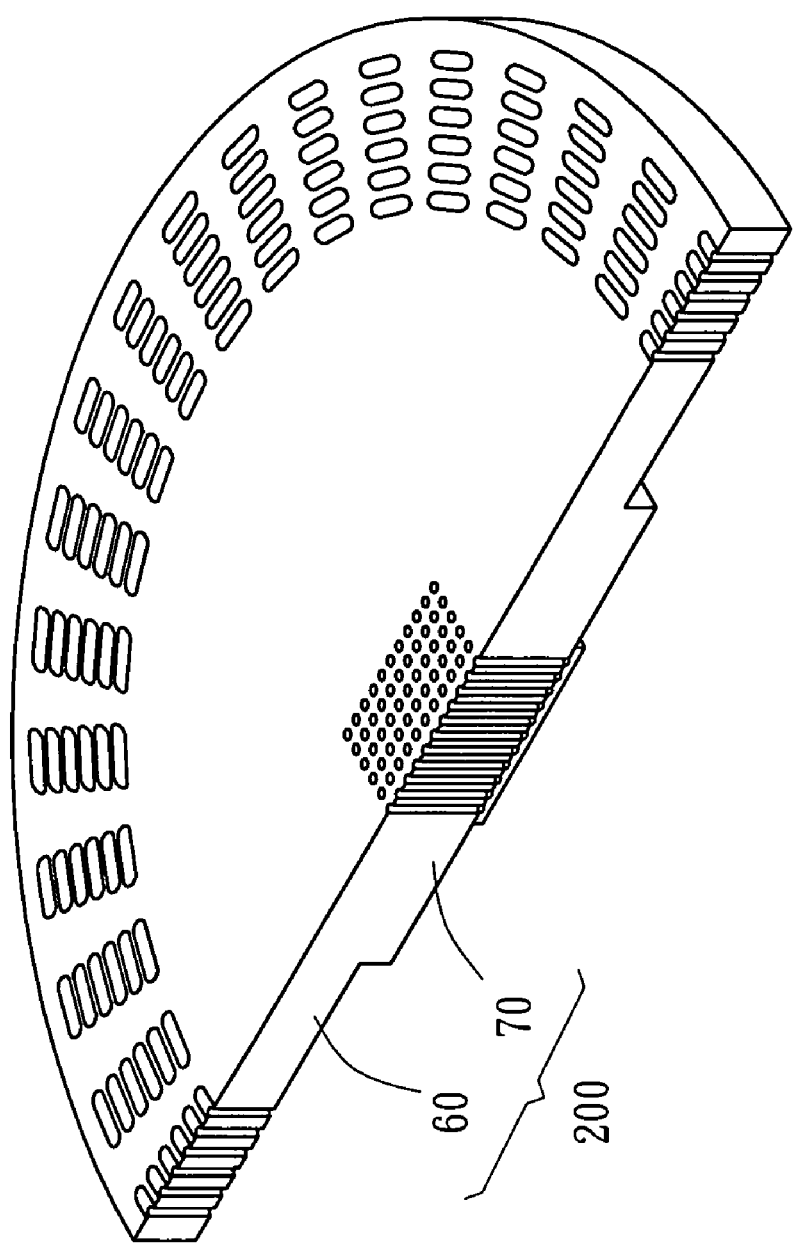
FIG. 5 is a schematic perspective view of a stepped PCB according to a second preferred embodiment of the present invention.

FIG. 5 shows a stepped PCB constructed according to the second preferred embodiment of the present invention. According to this embodiment, the stepped PCB, referenced by 200, comprises a main body 60 and a protruding body 70, which are integrally made.

In this embodiment, the thickness of the main body 60 is made greater than the clamping range of the testing machine when the main body 60 is originally made. Thereafter, the border area of the bottom side of the main body 60 is removed (by means of local etching or any PCB stripping method), and therefore the bottom center area of the main body 60 (the area that is beyond the testing machine clamping area) constitutes the protruding body 70. This embodiment achieves the same effect as the aforesaid first preferred embodiment does.

What is claimed is:

1. A stepped printed circuit board for a probe card and for clamping by a testing machine, the stepped printed circuit board comprising:

a main body having a conductive circuit pattern arranged therein, a protruding body portion protruding from a bottom side of the main body, and a border area surrounding the protruding body for the clamping of the testing machine;

the protruding body having a thickness greater than a thickness of the border area such that a bottom surface of said protruding body and a bottom surface of said border area define an elevational difference, said protruding body having a conductive circuit pattern arranged therein and electrically connected to the conductive circuit pattern of said main body;

wherein said protruding body is integrally formed together with said main body as a single-piece structure.

2. The stepped printed circuit board as claimed in claim 1, wherein said main body is made by laminating a material selected from a group consisting of FR-4, FR-5, polyimide and BT by a built up process at a predetermined temperature and pressure.

3. The stepped printed circuit board as claimed in claim 1, wherein said main body has a first side, a second side opposite to said first side, and a plurality of conductive contacts respectively arranged on said first side and said second side beyond said border area and respectively electrically connected to said conductive circuit pattern of said main body; wherein the conductive contacts at said first side are adopted for electrically connecting the testing machine, and the conductive contacts at said second side are electrically connected to the conductive circuit pattern of said protruding body.

4. The stepped printed circuit board as claimed in claim 1, wherein said border area has a thickness substantially ranging form 3.2 mm to 7.0 mm.

5. The stepped printed circuit board as claimed in claim 1, wherein said main body has a width substantially ranging from 6 inches to 17 inches.

6. The stepped printed circuit board as claimed in claim 1, wherein said protruding body has a size smaller than that of said main body.

7. The stepped printed circuit board as claimed in claim 1, wherein a plurality of conductive contacts are arranged on said bottom surface of said protruding body and electrically connected to said conductive circuit pattern of said protruding body; wherein the conductive contacts at said bottom surface are respectively electrically connected to the conductive circuit pattern of said main body, and the conductive contacts at said bottom side are adopted for electrically connecting an adapter substrate.

8. The stepped printed circuit board as claimed in claim 1, wherein said elevational difference ranges substantially from 0.5 mm to 6.0 mm.

9. The stepped printed circuit board as claimed in claim 1, wherein said protruding body has a width within 16 inches.

* * * * *